United States Patent [19]

Yamamura et al.

[11] Patent Number: 5,615,148
[45] Date of Patent: Mar. 25, 1997

[54] NONVOLATILE SEMICONDUCTOR MEMORY

[75] Inventors: Toshio Yamamura; Hiroto Nakai, both of Yokohama, Japan

[73] Assignee: Kabushiki Kaisha Toshiba, Tokyo, Japan

[21] Appl. No.: 622,088

[22] Filed: Mar. 26, 1996

[30] Foreign Application Priority Data

Mar. 28, 1995 [JP] Japan ..................................... 7-069154

[51] Int. Cl.$^6$ .................................................. G11C 11/34
[52] U.S. Cl. ................................ 365/185.11; 365/185.29; 365/185.3
[58] Field of Search ......................... 365/185.11, 185.29, 365/185.3, 218

Primary Examiner—David C. Nelms
Assistant Examiner—F. Niranjan
Attorney, Agent, or Firm—Loeb & Loeb LLP

[57] ABSTRACT

EEPROM for directly outputting addresses of those in which erasing failure occurs among a plurality of blocks to be erased for erasing by a plural block simultaneous erasing system to an outside of a chip and enabling a system side to directly identify the addresses thereof is provided with a plurality of cell blocks each having an array of nonvolatile memory cells, plural block simultaneous erasing control arrangement for performing cell data erasing from a plurality of cell blocks specified as to be erased for simultaneous data erasing and a block address outputting circuit for outputting, when existence of erase failure blocks is detected after block simultaneous erasing, addresses thereof to the outside of the chip.

9 Claims, 9 Drawing Sheets

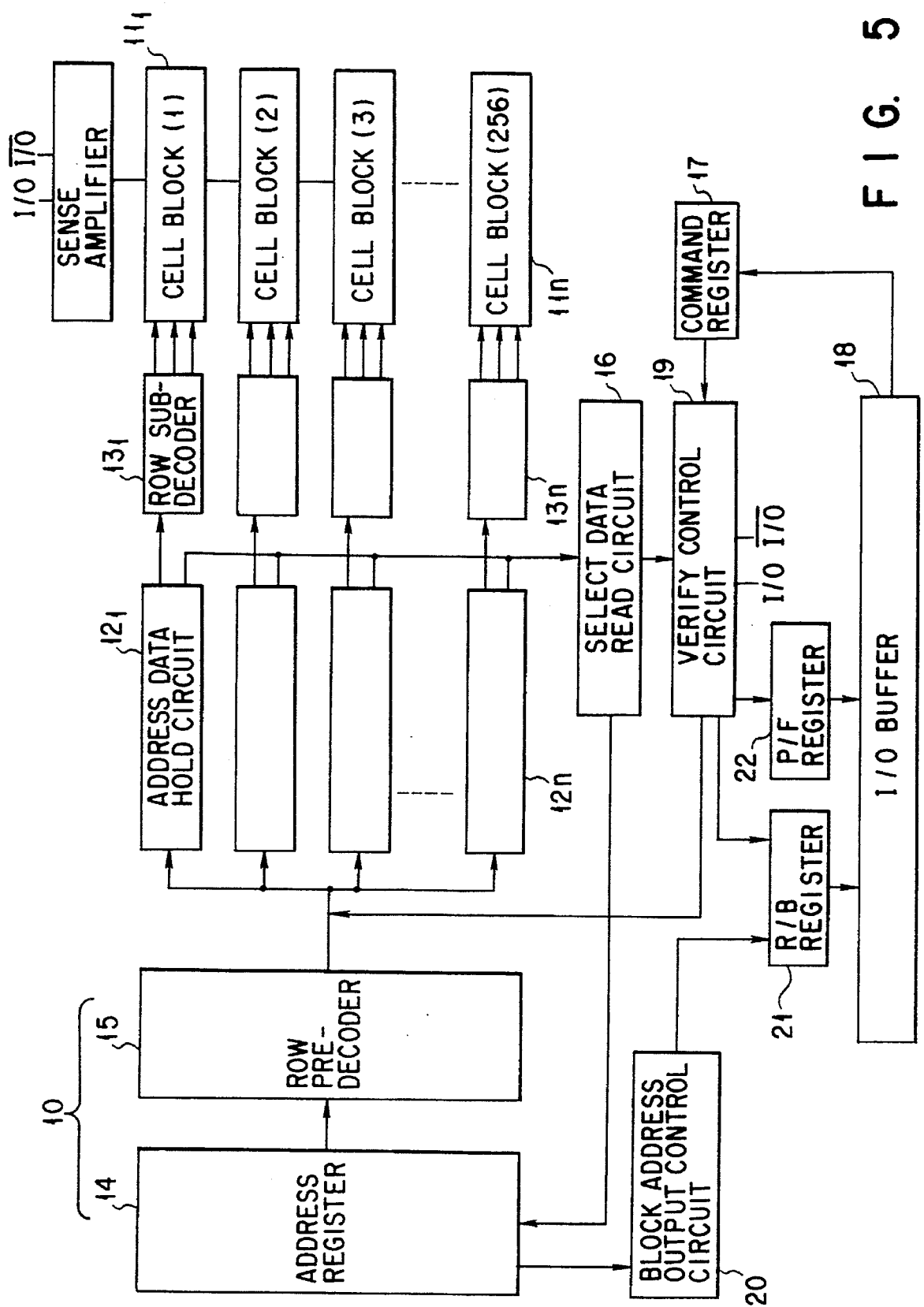
F I G. 5

NONVOLATILE SEMICONDUCTOR MEMORY

BACKGROUND OF THE INVENTION

1. Field of the Invention

The present invention relates to an electrically erasable and reprogrammable nonvolatile semiconductor memory (EEPROM). More particularly, the invention relates to a memory having a system for simultaneously erasing a plurality of cell blocks.

2. Description of the Related Art

In an EEPROM (electrically erasable and reprogrammable nonvolatile memory) using a stacked gate type MOS transistor of a structure in which a floating gate and a control gate are stacked, there have been known, as systems for erasing data in a memory cell, a chip erasing system in which data in all memory cells on a memory chip are flashed, i.e., simultaneously erased and an individual block erasing system in which a memory cell array is divided into a plurality of cell blocks and data in the cells in the cell blocks are flashed, i.e., simultaneously erased by block units. There has also been disclosed a plural block simultaneous erasing system in which data in a selected cell blocks are flushed, i.e., simultaneously erased so as to make an erasing period shorter than the individual block erasing system (Japanese Patent Application No. 4-281193 relating to a co-pending application filed by the present applicant).

In an EEPROM having such an individual block erasing system or a plural block erasing system, selection/nonselection is performed for each block so as enable reading, writing and erasing data therein.

FIG. 10 is a view showing a part of a first preferred embodiment of EEPROM disclosed in Japanese Patent Application No. 4-281193. The disclosed EEPROM has a plural block erasing system.

In the drawing, $11_1$ to $11n$ are a plurality of cell blocks each having an array of a plurality of nonvolatile memory cells, in which data in selected cell blocks are simultaneously erased by applying erasing voltages to control gates of the memory cells of the selected cell blocks. $12_1$ to $12n$ are a plurality of address data hold circuits provided corresponding to the plurality of cell blocks $11_1$ to $11n$ to hold select data indicating selection of the corresponding cell blocks. $13_1$ to $13n$ are a plurality of row subdecoders provided corresponding to the plurality of cell blocks $11_1$ to $11n$. These row subdecoders select and erase all the memory cells of the corresponding cell blocks $11_1$ to $11n$ if the select data are held in the corresponding select data hold circuits by applying erasing voltages to the control gates thereof.

An address register 14 holds a block address signal specifying one of block addresses (0 to 255) of the plurality of cell blocks $11_1$ to $11n$.

A row predecoder 15 decodes a block address signal input from the address register 14 or an address buffer (not shown). The row predecoder 15 functions as a select data input circuit to input a select data selecting a specified cell block to a select data hold circuit corresponding to the specified cell block. In the simultaneous erasing of data in the plurality of blocks, the predecoder 15 inputs, by responding to a plurality of block addresses specifying a plurality of cell blocks from which data are to be erased, select data to the select data hold circuits corresponding to the specified plurality of cell blocks from which data are to be erased.

A select data read circuit 16 reads select data held in the plurality of select data hold circuits $12_1$ to $12n$. A command register 17 holds a command signal input via an I/O buffer 18. A verify control circuit 19 controls, upon receiving the command signal from the command register 17, a cell data reading operation performed so as to check (hereinafter called verify reading operation) whether cell data have been sufficiently erased from the target blocks or not, based on the select data read from the select data read circuit 16. The verify control circuit 19 also controls a content (block addresses) of the address register 14 while performing the verify reading operation.

A memory chip having such a plural block erasing system is usually used in a manner that a plurality of such chips are assembled in a memory and incorporated in a computer system, etc. In order to secure reliability of data, redundancy chips are generally provided in such a system.

In the memory chip, by means of a sequencer circuit (not shown), a series of operations from erasing to verify reading after erasing are controlled with respect to a plurality of simultaneous erasing blocks specified to be erased by the system side. When it is determined that requirements for erasing are not satisfied, an erase error signal (fail end signal indicating failure of an erasing operation) indicating erasing failure is output to the outside of the chip. In this case, a system for repeating controlling of a series of operations from erasing to verify reading by a specified number of times until the requirements for erasing are met may be utilized. By means of this system, when it is determined that the requirements are not satisfied even by repeating controlling of the operations by the specified number of times, an erase error signal, that is, a fail end signal, is output to the outside of the chip.

When the erase operation is in failure, it is required for the system side to replace the erase failure block with a cell block of a redundancy chip. To achieve this requirement, operations are carried out in the system side to detect the address of the erase failure block, convert the detected address to an address in the redundancy chip and store the converted address. When an erase operation is carried out to specified cell blocks in a memory chip having the plural block simultaneous erasing system, thereafter an erase failure block exists in the specified cell blocks and thus the erase operation is ended in failure, then the system side is required to carry out a verify reading operation to all of the addresses of the specified cell blocks to determine the address of the erase failure block.

In the memory chip having a plural block erasing system presented in the Unexamined Patent Publication No. 4-281193, it is impossible to directly output addresses of erase failure blocks to the outside of the chip. Therefore, even when erase failure exists only in portions of the plurality of erasing target blocks (the requirements for erasing have not been satisfied) while erasing can be normally performed for the remaining blocks (the requirements for erasing have been met), in order to detect addresses of the erase failure blocks, upon receiving a fail end signal the system side must perform verify reading again for all the plurality of erasing target blocks. This means that verify reading is unnecessarily repeated for the blocks for which the erasing operations have been normal, and thus the operation time of the whole system is lengthened. To replace the erase failure block, the system side should have two functions, i.e., an address hold function and a verify function. The address hold function is to hold the addresses of the specified cell blocks to be erased until a pass signal is outputted for the erase operation, and the verify operation is to successively input addresses to all of the specified cell blocks to read data therefrom for verify. This complicates the structure of the system.

In this memory device, it is the precondition that the operations from the verify-read through the determination of pass/fail are automatically controlled in the write mode and the erase mode. When the erase operation is carried out, the system issues an erase command and addresses for specifying cell blocks to be erased to monitor an R/B (read/busy) signal to determine the end of the erase operation. The R/B signal can be monitored on R/B output terminal of the memory chip or the I/O terminal in the status read mode. After the erase operation end is detected, a P/F (pass/fail) information is checked while maintaining the status read mode. All the operation regarding the data erase is completed, when the erase operation is correctly performed. However, since erase failure will occur, though the probability is so low as one per millions, the system side is required to have the verify function and the P/F determination function. If probability of erase failure occurrence is zero, the verify function and the P/F determination function in the system side is not necessary.

As described above, in the EEPROM employing the plural block simultaneous erasing system presented in the Unexamined Patent Publication No. 4-281193, a problem has been that since the system side detects the addresses of the erase failure blocks even when erase failure exists only in portions of the plurality of cell blocks, verify reading is unnecessarily repeated for the blocks from which the data have been normally erased.

SUMMARY OF THE INVENTION

The present invention was made in order to solve the above-described problem. More particularly, it is an object of the invention to provide a nonvolatile semiconductor memory with a plural block simultaneous erasing system, which can directly output to the outside of the chip addresses of the cell blocks in which erase failure has occurred, of a plurality of cell blocks to be simultaneously erased and thus the system side can directly identify the erase error block addresses without unnecessarily repeating verify reading for the blocks from which data have sufficiently been erased.

Since above-mentioned memory chip has an automatic erase function, the verify function, and P/F determination function, and it is the concept of the present invention to only incorporate an error address output function, so that duplication of the verify function and the P/F determination function can be avoided to lighten the load of the system.

According to the present invention, there is provided a nonvolatile semiconductor memory comprising: a plurality of cell blocks each having an array of a plurality of nonvolatile memory cells, in which cell data are simultaneously erased from selected cell blocks; a plurality of select data holding means provided corresponding to the plurality of cell blocks, for holding select data indicating selection of corresponding cell blocks; select data inputting means for inputting select data to the respective select data holding means corresponding to those specified as to be erased for simultaneous data erasing among the plurality of cell blocks; a plurality of block erasing means provided corresponding to the plurality of cell blocks for selecting all the nonvolatile memory cells of the corresponding cell blocks if select data are held in the corresponding select data holding means when data are simultaneously erased from the plurality of blocks specified as to be erased for simultaneous data erasing and erasing data thereof; erase failure block detecting means for detecting existence of erase failure cell blocks by reading select data held in the select data holding means after data erasing performed by the block erasing means; and erase failure block address outputting means for outputting, when existence of erase failure cell blocks is detected by the erase failure block detecting means, a fail end signal for indicating the existence thereof and addresses of the erase failure cell blocks to an outside of a memory chip.

According to the invention, when existence of erase failure blocks is detected after cell data have been simultaneously erased from those specified among a plurality of cell blocks, it is possible to directly output addresses of erase failure blocks to the outside of the chip.

In the system side, the addresses of the erase failure blocks are directly identified without unnecessarily repeating verify reading for the blocks from which data have been sufficiently erased. Failure can thus be dealt with by immediately replacing the erase failure blocks with the blocks of the redundancy chips in the system, improving performance and reliability of the memory. Also, when the erase failure blocks are to be replaced by the redundancy blocks in the chips during product evaluation testing in a trial manufacture stage, an operation thereof is made simple, making it possible to efficiently perform the evaluation test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a block diagram showing a portion of a NAND type EEPROM of a second embodiment;

DETAILED DESCRIPTION OF THE PREFERRED EMBODIMENTS

Now, the preferred embodiments of the invention will be described in detail with reference to the accompanying drawings.

Figure 1:
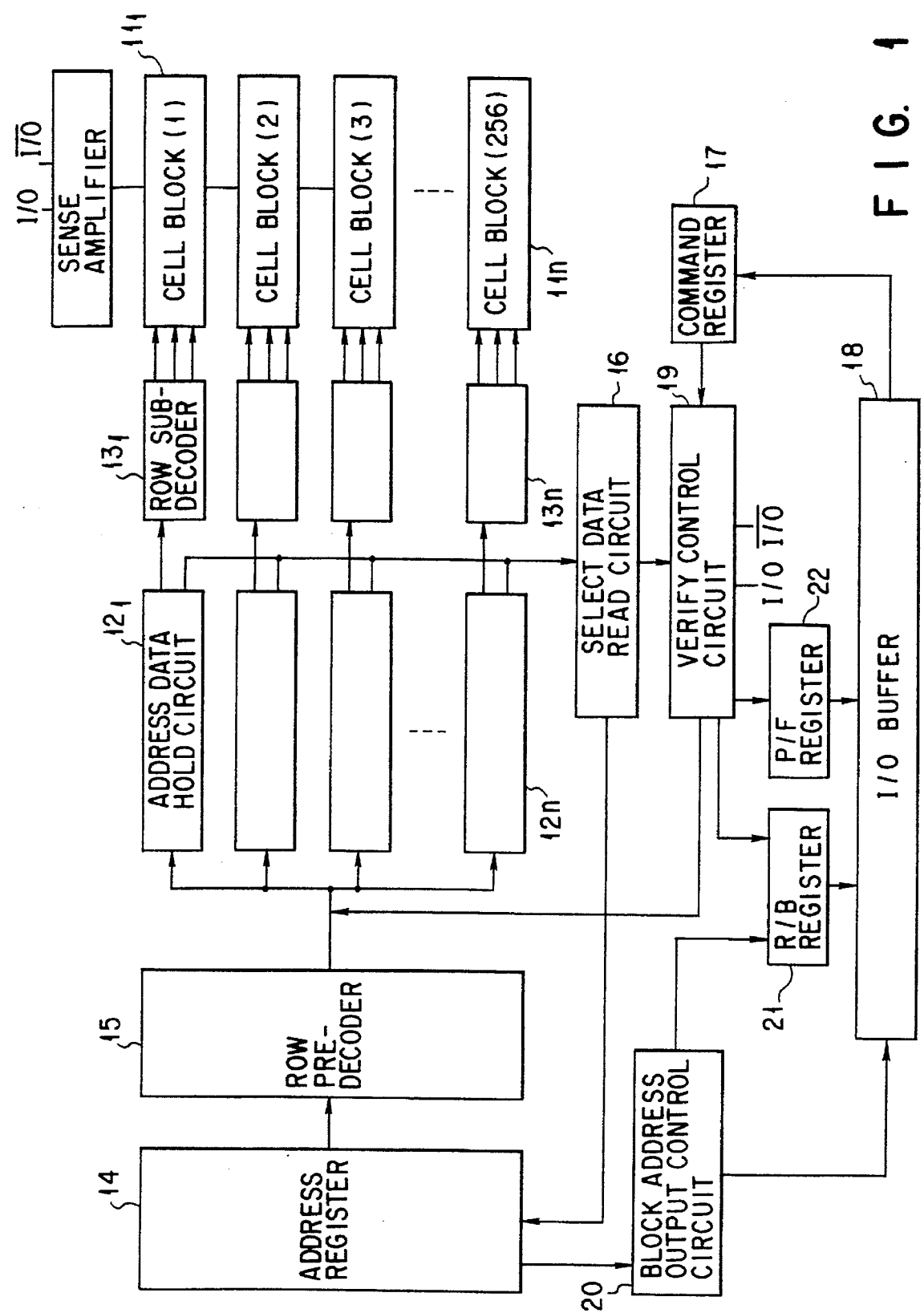
FIG. 1 is a block diagram showing a portion of a NAND type EEPROM of a first embodiment of the invention.

FIG. 1 shows a portion of a NAND type EEPROM having a plural block simultaneous erasing system of a first embodiment of the invention.

This EEPROM is structured by adding, to the EEPROM of an embodiment (first embodiment) of Japanese Patent Application No. 4-281193, a function of directly outputting addresses of erase failure blocks to the outside of a memory chip when existence thereof is detected.

More specifically, the EEPROM having reading/writing, block erasing, plural block simultaneous erasing operation modes is provided with a plurality of cell blocks $11_1$ to $11n$ each having an array of a plurality of nonvolatile memory cells, in which data are simultaneously erased from a plurality of selected cell blocks, a plurality of select data hold circuits $12_1$ to $12n$ provided corresponding to the plurality of cell blocks $11_1$ to $11n$ for holding select data indicating selection of corresponding cell blocks, a select data input circuit 15 for inputting select data to the select data hold circuits corresponding to the plurality of selected cell blocks specified as targets for simultaneous erasing when data are to be simultaneously erased from a plurality of cell blocks, a plurality of block erase circuits (row subdecoders) $13_1$ to $13n$ provided corresponding to the plurality of cell blocks for selecting, if the select data are held by the corresponding select data hold circuits in simultaneous erasing of data from the plurality of blocks, all the nonvolatile memory cells of the corresponding cell blocks and erasing data therefrom, erase failure block detect circuits 16 and 19 for detecting existence of erase failure cell blocks by reading the select data held in the select data hold circuits after data erasing performed by the block erase circuits, a fail signal output circuit 22 for outputting, when existence of erase failure cell blocks is detected by the erase failure block detect circuits, a fail end signal indicating the existence thereof to the outside of the memory chip, and an erase failure block address output circuit 20 for outputting, when existence of erase failure cell blocks is detected by the erase failure block detect circuits, addresses of the erase failure cell blocks to outside of the memory chip.

For the nonvolatile memory cells, a stacked gate type MOS transistor having a structure in which a floating gate and a control gate are laminated is used. A NAND type cell is constructed by connecting, for instance eight memory cells and two select transistors with one another in series and an array of a plurality of such NAND type cells is divided into a plurality of cell blocks $11_1$ to $11n$.

Figure 9:
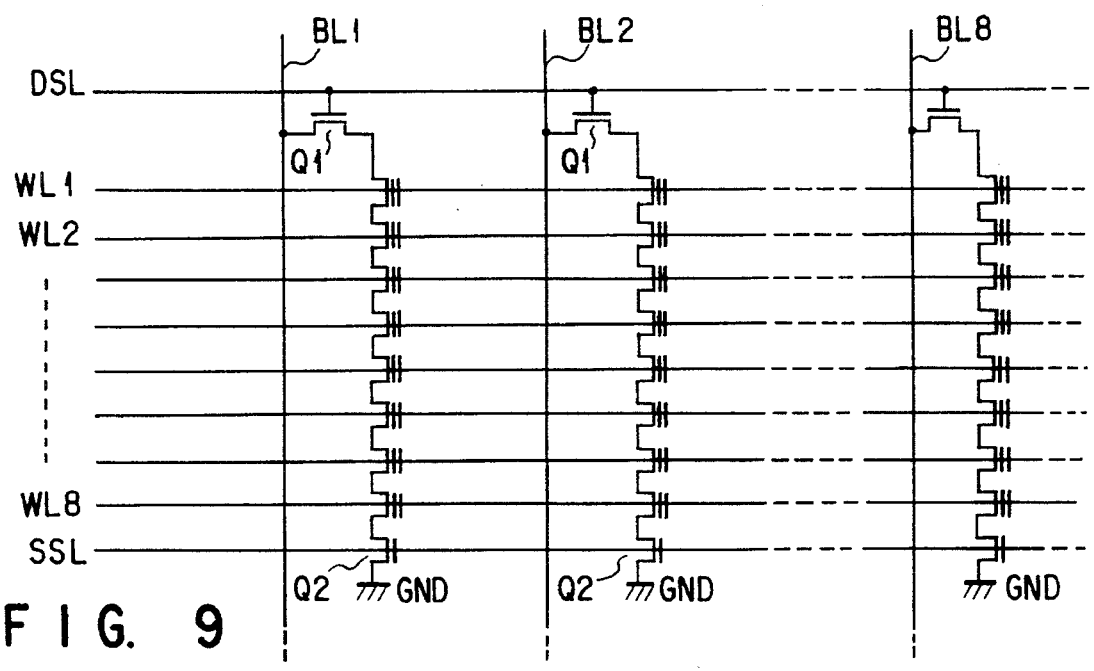
FIG. 9 shows an array of a NAND type EEPROM.

For example, in the case of a 4 megabit NAND type EEPROM as shown in FIG. 9, one page is constituted of 256 byte×8 bit memory cells, which are connected to one wordline. Each block is constituted of 8 pages of the memory cells, and the memory cell array is constituted of 256 blocks. Thus, in the memory cell array, 265 bytes of memory cells are provided in a column direction and 256 blocks of memory cells are provided in a row direction, constituting a 4 megabit cell array as a whole. This array is divided into 265 cell blocks in the row direction and each cell block is provided with a memory cell of 8×8×256=4 kilobyte.

An address register 14 holds a block address signal for specifying one of block addresses (0 to 255) of the plurality of cell blocks $11_1$ to $11n$. DSL and SSL denote gate select lines of the NAND gates. Gate select line DSL is connected to the gates of selected transistors Q1, and gate select line SSL is connected to the gates of gate select transistors Q2. BL1, BL2, ... BL8 denotes bit lines.

A row predecoder 15 decodes a block address signal input from the address register 14 or an address buffer (not shown). The row predecoder 15 functions as a select data input circuit for inputting select data to select a specified cell block to, among the select data hold circuits $12_1$ to $12n$, one corresponding to the specified cell block. In the plural block simultaneous erasing, this inputs select data to those among the select data hold circuits $12_1$ to $12n$ corresponding to a plurality of cell blocks specified as to be erased in response to a plurality of block addresses indicating the plurality of cell blocks for erasing. In this case, a plurality of cell blocks may be specified in sequence by inputting block addresses from the outside of the chip in sequence. Otherwise, a block address signal and a signal indicating the number of blocks are fetched into the chip based on a control signal input from the outside of the chip and thereby a plurality of cell blocks corresponding to a block address of this block address signal and the number of block addresses indicated by the block number signal may be specified.

The plurality of select data hold circuits $12_1$ to $12n$ transfer select data of a block specified by the row predecoder 15 to the corresponding row subdecoders $13_1$ to $13n$ when reading/writing of data or block erasing of data is performed. When data are simultaneously erased from a plurality of blocks, these hold select data of blocks specified by the row predecoder 15 and transfer these select data to the row subdecoders $13_1$ to $13n$ corresponding to the specified blocks. In this case, the select data held in the plural block simultaneous erasing are called erase flags.

The plurality of row subdecoders $13_1$ to $13n$ select the corresponding cell blocks $11_1$ to $11n$ when select data are transferred from the corresponding select data hold circuits $12_1$ to $12n$. The plurality of row subdecoders $13_1$ to $13n$ supply required voltages to memory cell and select transistor selection lines of a NAND type cell in a corresponding cell block in each operation mode during reading/writing of data or block erasing of data. In the simultaneous erasing of data from a plurality of blocks, these subdecoders supply voltages necessary for simultaneous erasing by selecting all the memory cells in corresponding cell blocks.

A select data read circuit 16 reads data held by the plurality of select data hold circuits $12_1$ to $12n$.

A command register 17 holds a command signal input via an I/O buffer 18. The I/O buffer 18 connected to the outside of the chip via an I/O pin (not shown) is for sending/receiving input/output data between the inside and the outside of the chip.

A verify control circuit 19 receives a control signal from the command register 17, controls a verify reading operation performed so as to check sufficient erasing of cell data in the to-be-erased blocks based on select data read by the select data read circuit 16, and controls increment of block address in the address register 14 in relation to the verify reading operation.

The select data read circuit 16 and the verify control circuit 19 function as erase failure block detect circuits for performing control so that verify reading is executed after the data erasing mode and detecting existence of cell blocks in which erasing of data has failed.

A structure of the NAND type cell, an operation principle in each operation mode, structures and operations of the select data hold circuits $12_1$ to $12n$ and structures and operations of the row subdecoders $13_1$ to $13n$ are like those described in the Unexamined Patent Publication No. 4-281193 and, detailed description of these will be omitted for the purpose of simplifying explanation, since these are not directly related to the erase failure block address output system in the EEPROM of the invention designed for performing plural block simultaneous erasing.

In the embodiment, the EEPROM is further provided with a block address output control circuit 20, a ready/busy signal register (R/B register) 21 and a pass/fail signal register (P/F register) 22.

The block address output control circuit 20 outputs block addresses of cell blocks in which erasing of data has failed when existence thereof is detected by the erase failure block detecting circuits.

The R/B register 21 holds a ready/busy signal R/B for notifying of access readiness of the chip (whether addresses of erase failure blocks can be read or not) to the outside thereof based on operation states of the verify control circuit 19 and the block address output control circuit 20 and outputting this to the I/O buffer 18.

The P/F register 22 holds a pass/fail signal P/F for notifying of a correct erasing operation to the outside of the chip based on an operation state of the verify control circuit 19 and outputting the pass/fail signal P/F to the I/O buffer 18.

Figure 2:
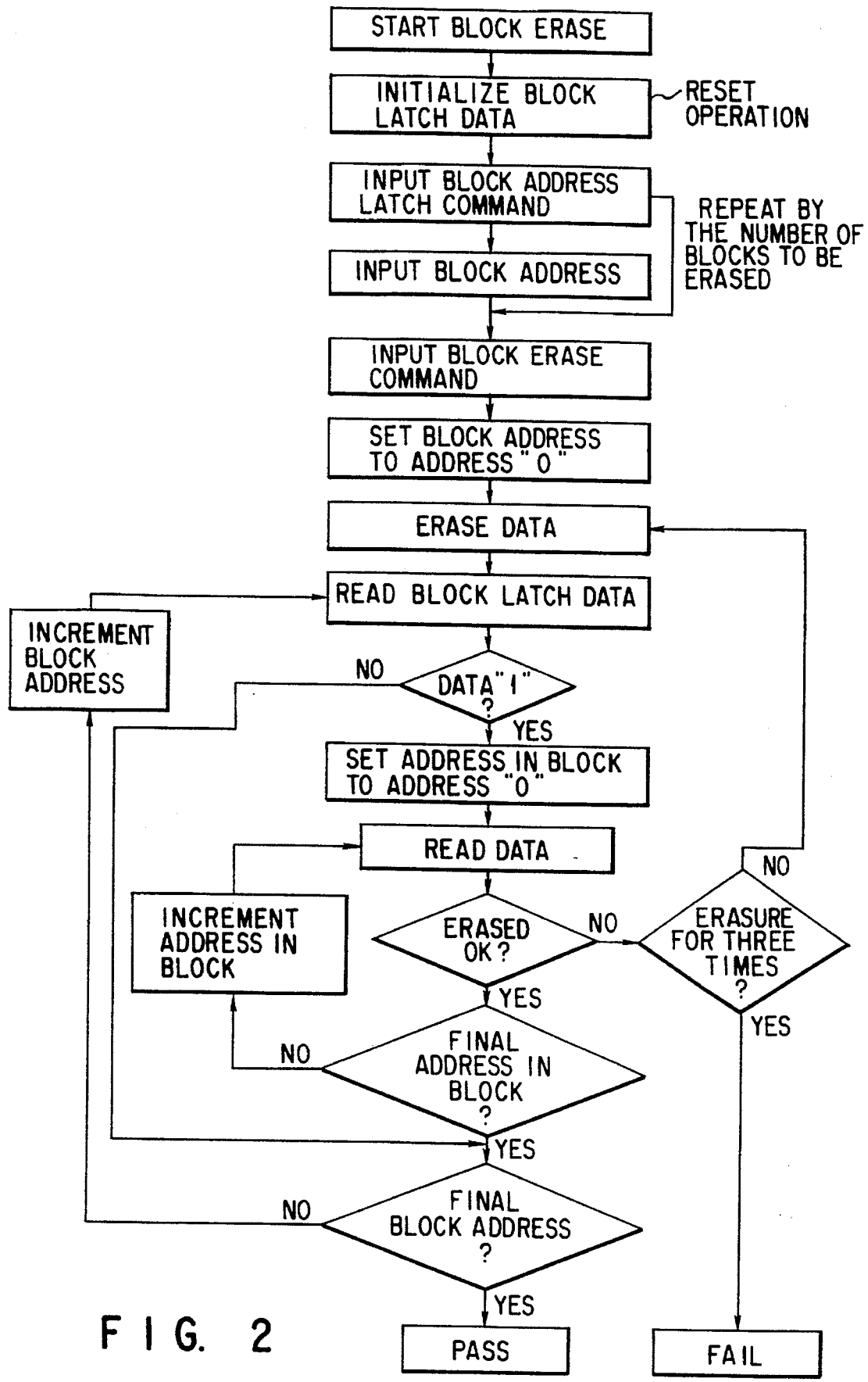
FIG. 2 is a flow chart showing an example of a plural block simultaneous erasing operation of the EEPROM shown in FIG. 1.
Figure 3:
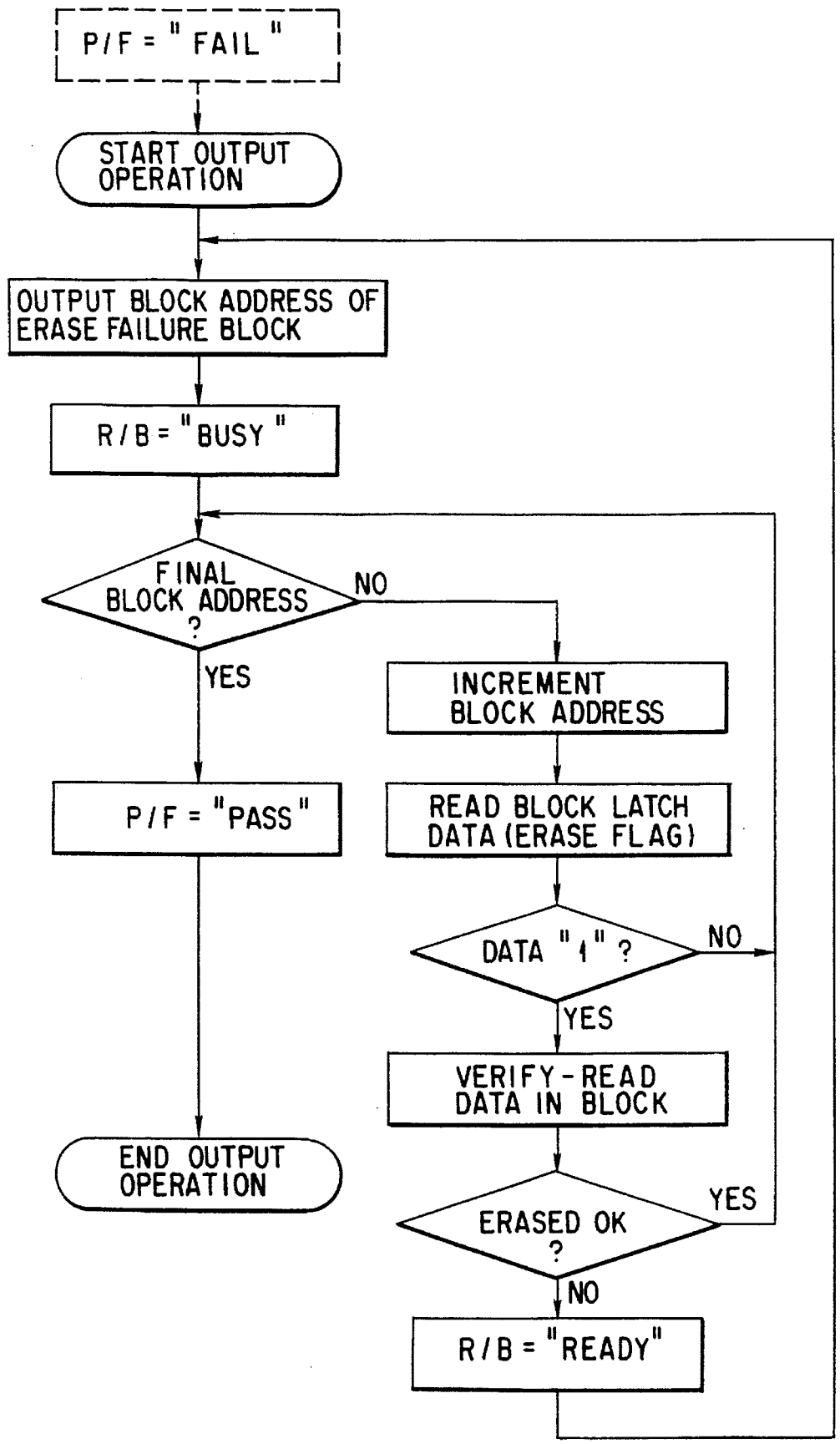
FIG. 3 is a flow chart showing an example of an operation of outputting erase failure block addresses performed during the plural block simultaneous erasing operation shown in FIG. 2.
Figure 4:
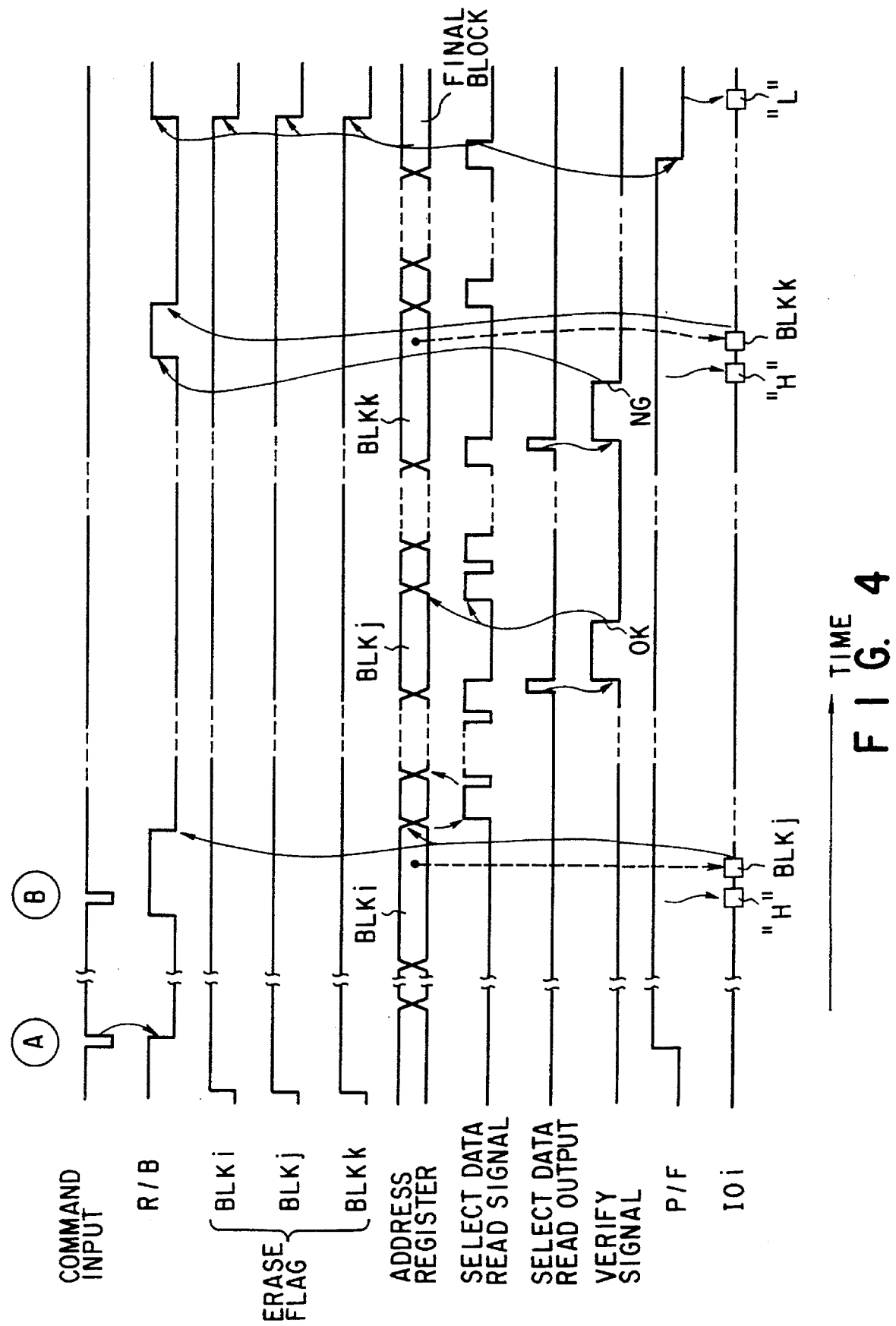
FIG. 4 is a timing chart showing an example of the outputting operation shown in FIG. 3.

FIG. 2 is a flow chart showing an example of a plural block simultaneous erasing operation in the EEPROM shown in FIG. 1. FIGS. 3 and 4 are flow and timing charts respectively showing an example of an operation of outputting erase failure block addresses performed in connection with the plural block simultaneous erasing operation shown in FIG. 2.

First, a plural block simultaneous erasing operation will be outlined by referring to FIG. 2.

When a plural block simultaneous erasing operation is to be started, a reset operation is first performed so as to initialize data held in all the select data hold circuits to "0" levels. Then, a block address latching operation is performed (so as to latch a block select signal output from the row predecoder in the select data hold circuit). At this time, by performing a block address latching operation for each of a plurality of sequentially input block addresses, erase flags are held, one each, by a plurality of select data hold circuits corresponding to a plurality of blocks specified by this plurality of block addresses.

Then, the plural block simultaneous erasing operation is started. In this operation, the erase flags held in the select data hold circuits are transferred to the row subdecoders and data are simultaneously erased from a plurality of cell blocks connected to the plurality of row subdecoders to which these erase flags have been transferred.

Then, a verify reading operation is performed. In this operation, a block address of the address register 14 is set to "0" (head address) before the data erasing, addresses are sequentially scanned from this head address to a final address, block latch data (erase flags) already held in the select data hold circuits corresponding to the respective addresses are read by the select data read circuit 16 and logical levels thereof are detected. Verify reading is not performed for the blocks in which the erase flags are at "0" levels (nonselection) but performed only for the blocks in which the erase flags are at "1" levels (selection). In the latter case, first addresses in the blocks (memory cell selection addresses) are set to "0" and verify reading is repeated until reaching the final memory selection addresses. When the blocks exist in which erasing of data has not been enough, the erasing operation and verify reading after erasing may be repeated up to, for instance, 3 times. If the data have not been sufficiently erased yet even by these operations (if existence of erase failure blocks is detected), a fail end signal is output indicating that this memory chip is a defective product in which the data erasing has failed.

As described above, since no verify reading is performed for the blocks in which the erase flags are at "0" levels, it is not necessary to read data from all the memory cells. This makes it possible to detect completion of block erasing within a short verifying time.

In the EEPROM, when erase failure blocks exist and data erasing end in failure, the address register 14 indicates block addresses of the erase failure blocks as of this time and no erase blocks exist in addresses before these addresses.

Furthermore, the erase flags held in the select data hold circuits corresponding to the blocks specified for data erasing are held without being reset even when erasing of data therefrom is confirmed by means of verify reading during a plural block simultaneous data erasing operation.

Next, explanation will be made in detail of a plural block simultaneous erasing operation and an operation for outputting addresses of erase failure blocks. It is now assumed that erase flags held in three select data hold circuits corresponding to, for instance three cell blocks to be erased, BLKi, BLKj and BLKk are set to "1" levels.

When a block erasing command signal A is input, erasing operations are started for the three cell blocks BLKi, BLKj and BLKk. At this time, a ready/busy signal R/B for notifying of access readiness of the chip to the outside of the chip is changed from an "H level (ready)" to an "L level (busy)". At the same time, a pass/fail signal P/F for notifying of a correct erasing operation to the outside of the chip is changed from an "L level (pass)" to an "H level (fail)".

Then, the erasing operation is ended after the lapse of a specified period. For instance, it is assumed that data has been normally, i.e., correctly erased from the cell block BLKj and it has failed in the other blocks BLKi and BLKj. If such erase failure blocks BLKi and BLKk exist, the signal P/F is kept in a failed state and by means of this signal P/F, failed ending of data erasing can be identified in the system side (user side) using the EEPROM.

When data erasing ends in failure, the EEPROM outputs a content (addresses) of the address register as of this time to the outside of the chip. Then, by continuing only a verifying operation and stopping this each time an erase failure block is detected, the EEPROM outputs a content of the address register to the outside as of this time. By means of this operation, it is possible to output all the addresses of the erase failure blocks.

In the first embodiment, in the system side, when a status data reading command signal B is input to the EEPROM after the erasing operation is ended, the signal P/F is confirmed and failed ending of data erasing is detected, an operation of outputting addresses of the erase failure blocks is started as shown in FIG. 3.

That is, the EEPROM outputs a first erase failure block address, turns a signal R/B output to a busy state and continues the verifying operation. In this verifying operation, block addresses stored in the block register 14 are incremented in sequence and by reading select data corresponding to each block a content thereof is confirmed. In this case, when a block with an erase flag set at "0" level (nonselection) is detected, without reading cell data therefrom the addresses in the address register 14 are incremented so as to select a next block. When a block with an erase flag set at "1" level is detected, a verify reading operation of cell data from this block is performed. As a result, when the block is determined to be one from which data is normally erased, the block addresses in the address register 14 are incremented so as to select a next block. Further, when the verify reading operation is carried out to a cell block detected as having a flag level of "1" level and the determination is that the data erase of the cell block is not correct, then the R/B signal is set to the ready state to inform to the system that an erase failure block exists.

When the system side detects the R/B signal to be the ready state, the data output enable pin to the chip is controlled to output the erase failure address. (Note: The "system" in this embodiment means a device (function) for controlling memory chips of the memory system having the memory chips and a controller chip for controlling the read, write and erase operations to the memory chips. Normally, the system controls the memory chips via commands. Commands are prepared for each of the read, write and erase operations. Thus, the system does not directly control circuits inside the memory chips. Control of data output is carried out by controlling data output control terminal OE pin or RE pin).

Then, in the EEPROM, the signal R/B output is turned to a busy state again as described above, the block addresses in the address register 14 are incremented so as to select a next block and a verify reading operation of cell data from this block is performed.

This operation is repeated until the final address is reached. When the final address is reached, by turning the signal P/F to the pass state, outputting of all the addresses of erase failure blocks is notified to the system side. In the system side, as long as a fail state of the signal P/F is detected, an operation of reading erase failure block addresses is continued.

According to the EEPROM of the first embodiment, since the addresses of the erase failure blocks are directly output to the outside of the chip, in the system side the addresses thereof can be directly identified. Therefore, in the system side, failure can be dealt with by immediately replacing the erase failure blocks by blocks of the redundancy chip in the system, making it possible to improve performance and reliability of the memory. Moreover, in the die sort step after the chip manufacturing, the erase failure block can be replaced with a redundancy block without carrying out a verify reading from the erase failure chip, resulting in reduction of the test time.

FIG. 5 is a view showing a portion of EEPROM having a plural block simultaneous erasing system of a second embodiment of the invention.

This EEPROM is an improvement on EEPROM of another embodiment (third embodiment) described in the Unexamined Patent Publication No. 4-281193.

The EEPROM of the third embodiment in the Unexamined Patent Publication No. 4-281193 outputs erase flags to a chip part in sequence when data erasing has failed due to existence of erase failure blocks during plural block simultaneous erasing. In this way, in a system side, addresses of the erase failure blocks can be known by detecting the output erase flags and converting data thereof into the erase failure block addresses.

In this case, however, it is necessary to convert the data of the output erase flags into the erase failure block addresses in the system side. Thus, when an erasing operation is to be performed by selecting the small number of blocks for data erasing, processing efficiency until addresses of erase failure blocks are converted in the system side is low.

Therefore, the EEPROM of the second embodiment is devised, as in the case of the first embodiment, so as to enable a system side to efficiently detect addresses of erase failure blocks by adding a function of directly outputting the addresses of the erase failure blocks to the outside of a memory chip in the form of data, without directly outputting erase flags to the outside of the chip in sequence, when existence of the erase failure blocks is detected.

This EEPROM is different from the EEPROM of the first embodiment previously described by referring to FIG. 1 in the following (1) and (2). Other parts than these are the same and thus by giving the same reference signs to the same parts as those shown in FIG. 1, explanation thereof will be omitted.

(1) When normal data erasing from a cell block is detected, a "1" level erase flag of a select data hold circuit corresponding to this cell block is rewritten to a "0" level.

(2) When data erasing ends in failure because of existence of erase failure blocks in the plural block simultaneous erasing, erase flags corresponding to all blocks to be erased for data simultaneous erasing are sequentially read by the select data read circuit 16. This erase flag reading operation is stopped when erase failure blocks are found in which the erase flags have been set to "1" levels and block addresses as of this time are output from the address register 14.

In this embodiment, the verify reading is carried out to the cell block whose corresponding select data hold circuit holds "1" level, while successively incrementing the block address from "0" address to the final address. As a result of the verify-reading, data held in the select data hold circuit corresponding to a correct-erase block whose cell data are correctly erased is reset from "1" level to "0" level. On the other hand, for the erase failure block, a re-erase execution flag rather than the corresponding select data hold circuit is set. After the check of data held in the select data hold circuits and the verify-reading of the to-be-erased block whose cell data to be erased up to the final block address are ended, when data of the re-erase execution flag is in "1" level, the erase erase operation is again carried out to the memory chip. If an erase failure block exists even after the erase operation and verify read operation are repeated for three times, the erase operation ends in failure. The block whose corresponding select data hold circuit holds the "1" level is an erase failure block.

Figure 6:
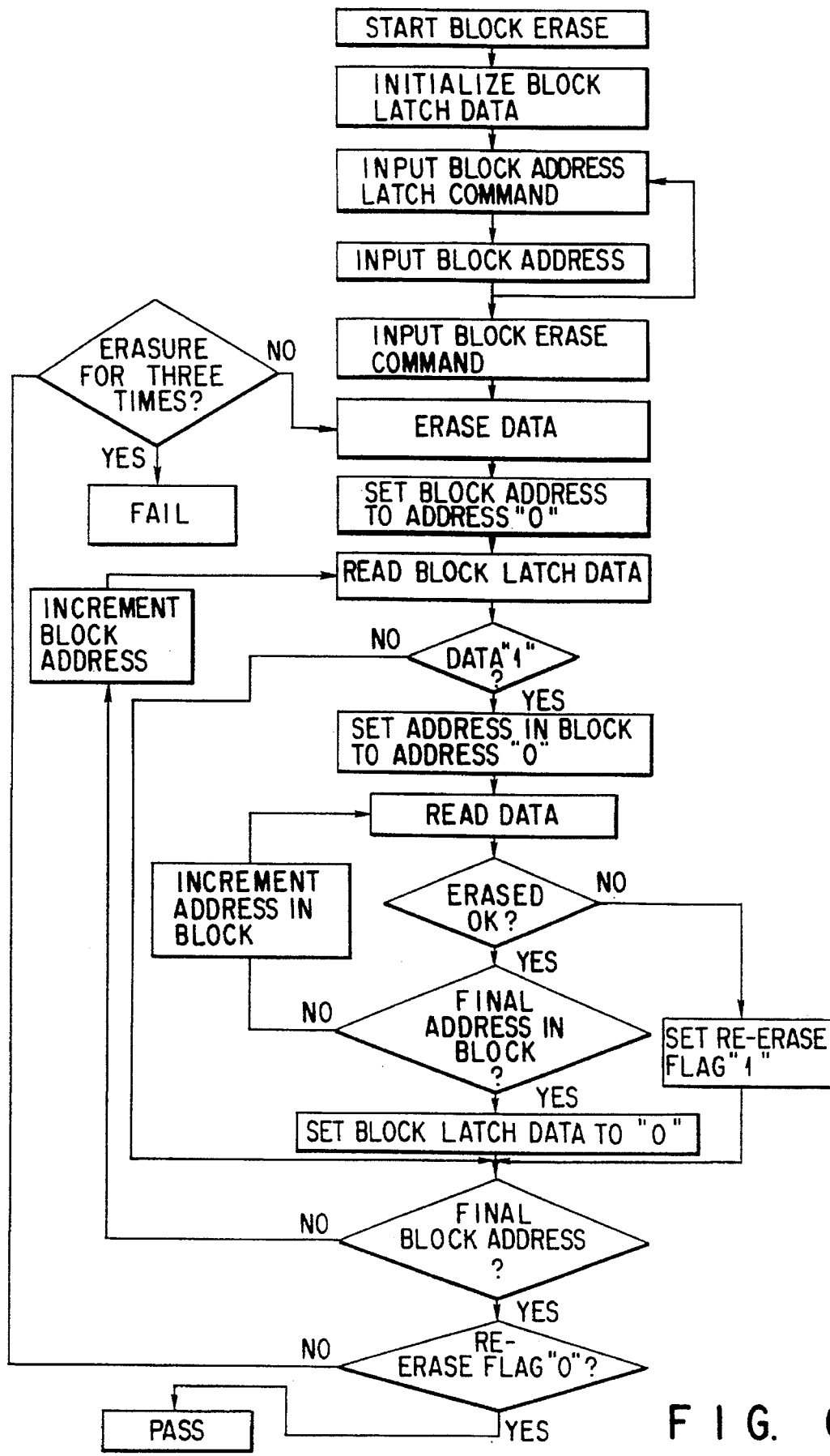
FIG. 6 is a flow chart showing an example of a plural block simultaneous erasing operation of the EEPROM shown in FIG. 5.
Figure 7:
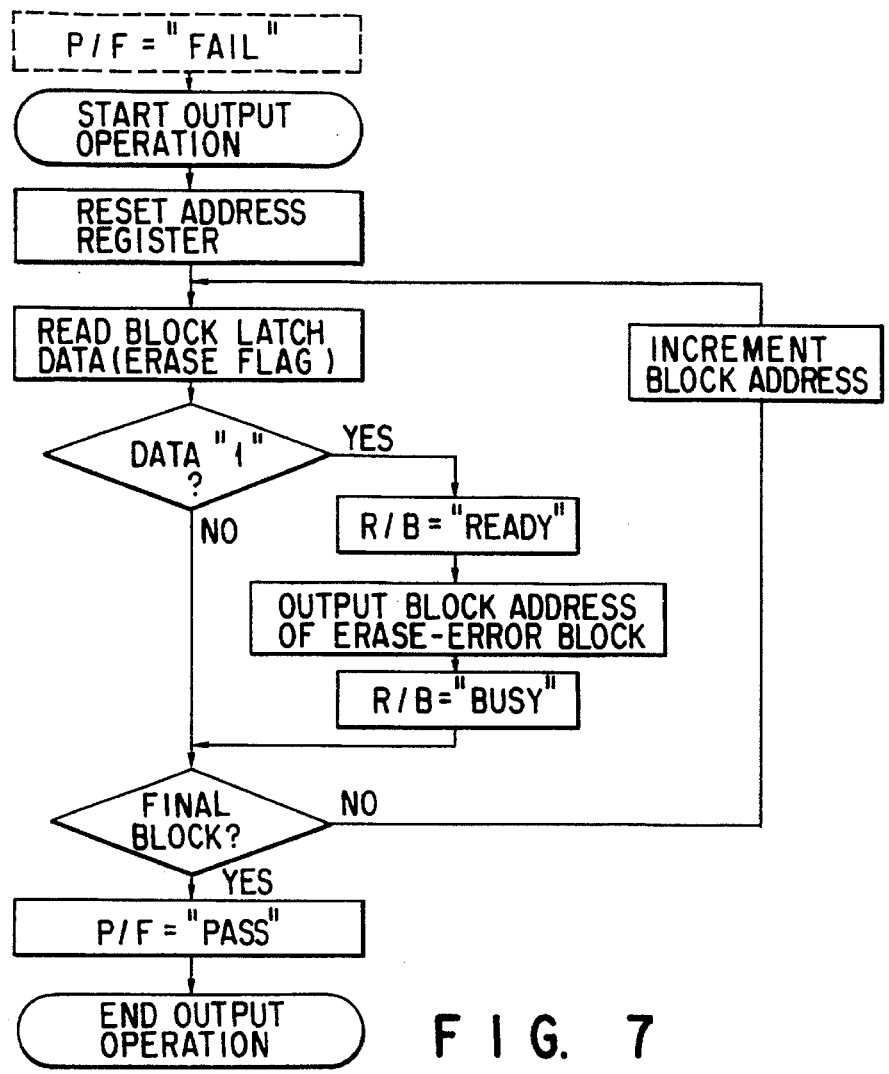
FIG. 7 is a flow chart showing an example of an operation of outputting erase failure block addresses performed during the plural block simultaneous erasing operation shown in FIG. 6.
Figure 8:
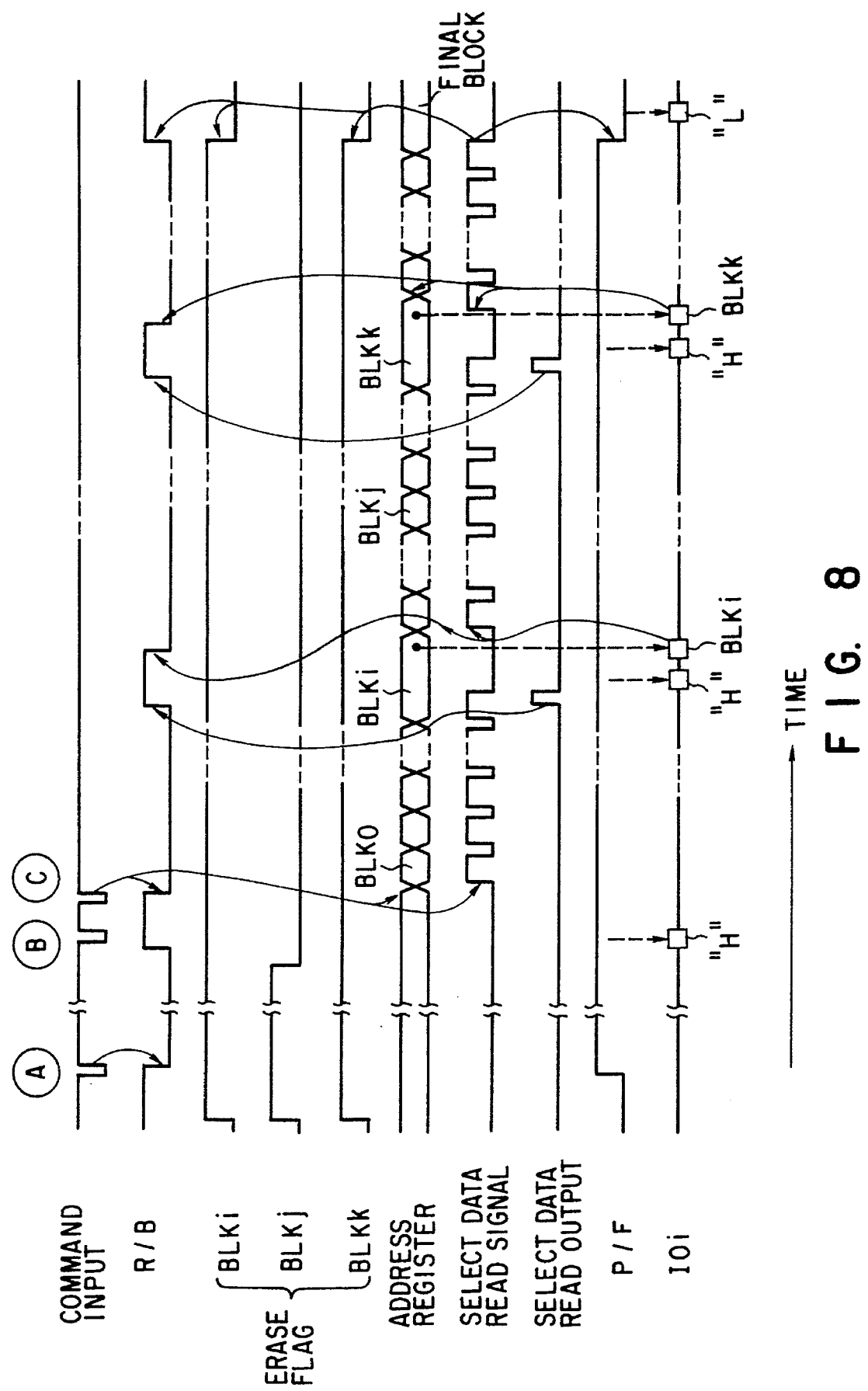
FIG. 8 is a timing chart showing an example of the outputting operation shown in FIG. 7.
Figure 10:
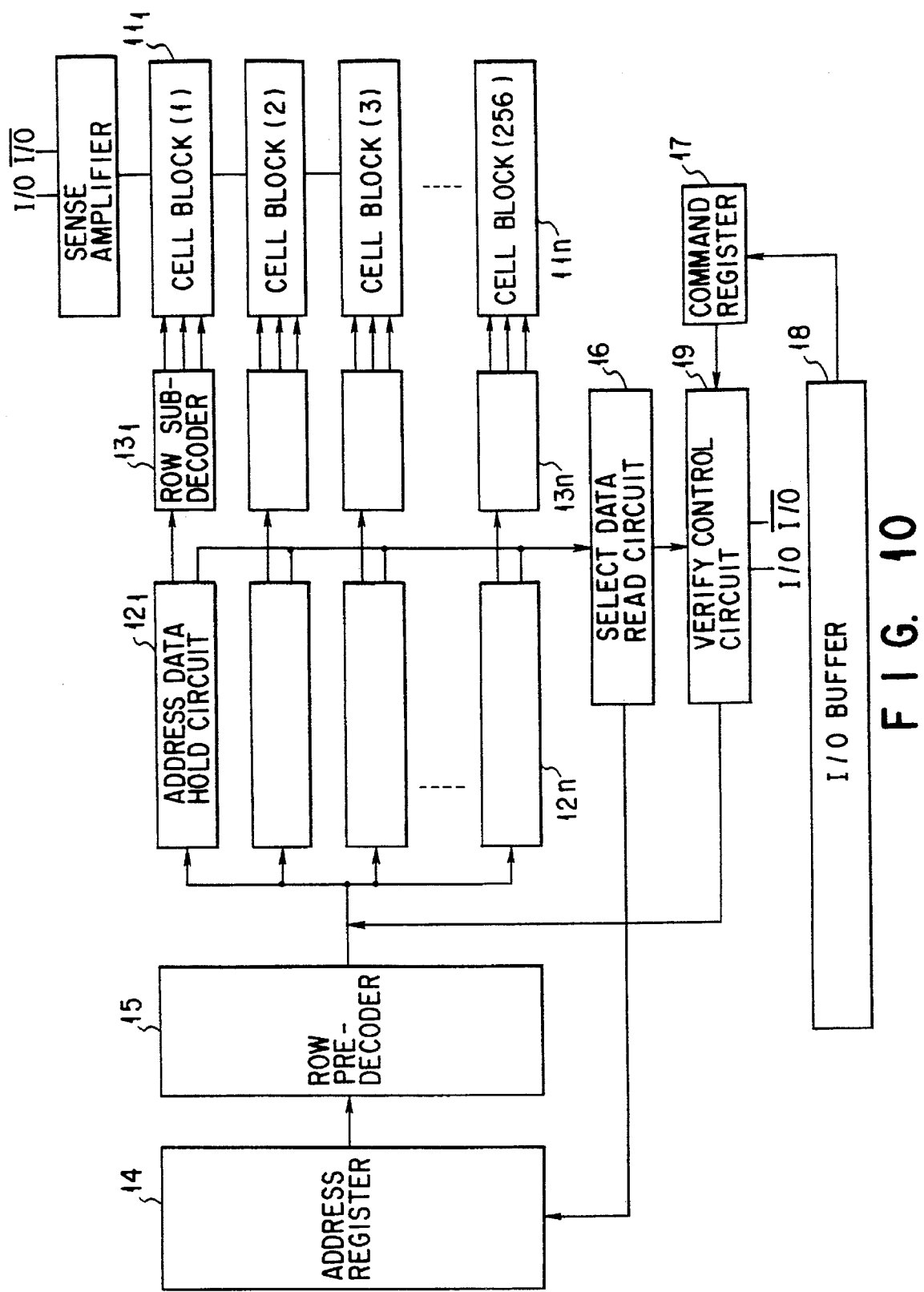
FIG. 10 is a block diagram showing a portion of a NAND type EEPROM having a plural block simultaneous erasing system disclosed in Japanese Patent Application No. 4-281193.

FIG. 6 is a flow chart showing an example of the plural block simultaneous erasing operation shown in FIG. 5. FIGS. 7 and 8 are flow chart and timing chart showing an example of an operation of outputting erase failure block addresses performed in connection with the plural block simultaneous erasing operation shown in FIG. 6.

The plural block simultaneous erasing operation shown in FIG. 6 is different from that in the EEPROM of the first embodiment described by referring to FIG. 2 in the following (1) and (2).

(1) A re-erase flag of each block is read after data erasing. When data erasing from all the cells in the block has been sufficient, an operation of rewriting "1" level latch data (re-erase flag) of a select data hold circuit corresponding to the block to a "0" level is performed.

(2) Re-erase flags corresponding to all blocks to be erased for simultaneous erasing are retrieved in the chip. If there are erase failure blocks in which the re-erase flags kept at "1" levels are held, this retrieving operations is stopped and block addresses as of this time are output from the address register 14. In this way, it is possible to output all the addresses of erase failure blocks.

In this embodiment, the verify reading is carried out to the cell block whose corresponding select data hold circuit holds "1" level, while successively incrementing the block address from "0" address to the final address. As a result of the verify-reading, data held in the select data hold circuit corresponding to a correct-erase block whose cell data are correctly erased is reset from "1" level to "0" level. On the other hand, for the erase failure block, a re-erase execution flag rather than the corresponding select data hold circuit is set. After the check of data held in the select data hold circuits and the verify-reading of the to-be-erased block whose cell data to be erased up to the final block address are ended, when data of the re-erase execution flag is in "1" level, the erase operation is again carried out to the memory chip. If an erase failure block exists even after the erase operation and verify read operation are repeated for three times, the erase operation ends in failure. The block whose corresponding select data hold circuit holds the "1" level is an erase failure block.

Next, explanation will be made of examples of a plural block simultaneous operation and an operation of outputting erase failure block addresses performed in the EEPROM shown in FIG. 5 by referring to FIGS. 6 to 8.

It is assumed that each of re-erase flags held in three select data hold circuits corresponding to, for instance three cell blocks to be erased for data erasing, BLKi, BLKj and BLKk is set to a "1" level (selection state).

When a block erasing command A is input, an operation of erasing data from the three cell blocks is started. At this time, a ready/busy signal R/B for indicating access readiness of the chip to the outside of the chip is changed from a ready state to a busy state. At the same time, a pass/fail signal P/F for indicating normal execution of the erasing operation to the outside of the chip is changed from a pass state to a fail state.

Then, the erasing operation is ended after the lapse of a specified period. It is assumed that erasing has been normally operated only, for instance in the cell block BLKj while erasing has failed in the other blocks BLKi and BLKk. As long as such erase failure blocks BLKi and BLKk exist, the pass/fail signal P/F is kept in the fail state and thus by means of this pass/fail signal P/F, failed ending of the erasing operation can be identified by a system side (user side) using the EEPROM.

In the EEPROM, re-erase flags corresponding to all blocks to be erased for data simultaneous erasing retrieved in the chip. This re-erase flag retrieving operation (erase failure block retrieving operation) is stopped when blocks (erase failure blocks) are found in which the re-erase flags have been maintained to "1" levels and block addresses as of this time are output from the address register 14, whereby it is possible that addresses of all of the erase failure blocks are output.

Therefore, in the second embodiment, in the system side, after the erasing operation is ended, status data is read from the EEPROM, a command signal B is input and the pass/fail signal P/F is confirmed. Then, when failed ending is detected, an erase failure block address output command signal C is input and an operation of outputting addresses of the erase failure blocks is started as shown in FIG. 7.

Upon receiving the command signal C, the EEPROM resets the address register 14 to address "0". Then, while incrementing block addresses stored in the address register 14 in sequence, the EEPROM reads latch data (re-erase flags) corresponding to respective blocks to be erased for simultaneous data erasing and confirms contents thereof (performs a retrieving operation). When existence of blocks in which re-erase flags are at "1" levels (erase failure blocks) is detected, a ready/busy signal R/B is turned to a ready state and the retrieving operation is stopped.

In the system side, after the ready/busy signal R/B is turned to the ready state, an operation of reading addresses of the erase failure blocks is started.

In the EEPROM side, when the reading operation is ended, the ready/busy signal R/B is turned to a busy state and the retrieving operation is automatically continued. Such an operation is repeated until the final address. When the final address is reached, a pass/fail signal P/F is turned to a pass state and outputting of all the addresses of the erase failure blocks is notified to the system side.

The system side reads the pass/fail signal P/F each time when the ready/busy signal R/B becomes the ready state, and continues the reading operation of block addresses of an erase failure blocks until the pass/fail signal P/S issues "pass". When the pass/fail signal P/S issues "pass", all of the erase failure blocks are output, and the output operation of the addresses of the erase failure blocks are completed.

By means of the operations described above, in the EEPROM of the second embodiment, as in the case of the EEPROM of the first embodiment, the erase failure block addresses are directly output to the outside of the chip, enabling the system side to directly identify the addresses thereof.

The invention can be applied not only to the above-described NAND type EEPROM but also to a NOR type EEPROM. This can also be applied to EEPROM having any type of erasing system of one for applying a ground potential to a control gate or one for applying a negative voltage thereto when data are to be erased from memory cells.

In the above description of the preferred embodiments, reference was made only to the EEPROM having the plural block simultaneous erasing system. Needless to say, the invention can be applied to EEPROM having a system for writing data en block into a plurality of blocks by using the same embodiments.

It is clear from the foregoing description that according to the nonvolatile semiconductor memory of the invention, it is possible to directly output addresses of those in which data erasing has failed, among a plurality of blocks selected as to be erased for simultaneous erasing by means of the plural block simultaneous erasing system, to the outside of the chip. Therefore, in the system side, the addresses of the erase failure blocks can be directly identified without unnecessarily repeating verify reading for the blocks from which data have been sufficiently erased. This makes it possible to immediately replace erase failure blocks with blocks of the redundancy chips is the system, improving performance and reliability of the memory.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory comprising:
   a plurality of cell blocks each having an array of a plurality of nonvolatile memory cells, in which cell data are simultaneously erased from selected cell blocks;

a plurality of select data holding means provided corresponding to the plurality of cell blocks, for holding select data indicating selection of corresponding cell blocks;

select data inputting means for inputting select data to the respective select data holding means corresponding to those specified as to be erased for simultaneous data erasing among the plurality of cell blocks;

a plurality of block erasing means provided corresponding to the plurality of cell blocks for selecting all the nonvolatile memory cells of the corresponding cell blocks if select data are held in the corresponding select data holding means when data are simultaneously erased from the plurality of blocks specified as to be erased for simultaneous data erasing and erasing data thereof;

erase failure block detecting means for detecting existence of erase failure cell blocks by reading select data held in the select data holding means after data erasing performed by the block erasing means; and erase failure block address outputting means for outputting, when existence of erase failure cell blocks is detected by the erase failure block detecting means, a fail end signal for indicating the existence thereof and addresses of the erase failure cell blocks to an outside of a memory chip.

2. A nonvolatile semiconductor memory according to claim 1, further comprising:

a ready/busy signal register for holding a ready signal when addresses of erase failure blocks are permitted to be read and a busy signal when the addresses of the erase failure blocks are inhibited to be read;

a pass/fail signal register for holding a pass signal when an erase operation is correctly ended, and a fail signal when the erase operation is ended in failure; and an address register constituting a part of the select data inputting means for holding block addresses for specifying cell blocks to be erased.

3. A nonvolatile semiconductor memory according to claim 2, wherein a check is performed to determine whether an erase information is stored in said erase information hold means while successively incrementing the contents stored in said address register; when it is found that an erase information is stored, a verify reading operation is performed to a cell block corresponding to the address of the detected erase information by said erase failure block detecting means; and only when an erase failure is detected, the contents of said address register is output to external via said erase block address outputting means.

4. A nonvolatile semiconductor memory according to claim 2, wherein a check is performed to determine whether an erase information is stored in said erase information hold means while successively incrementing the contents stored in said address register; and when an erase failure is detected, the checking operation is stopped and the contents of said address register is output to external via said erase block address outputting means.

5. A nonvolatile semiconductor memory according to claim 3, wherein, when the addresses of the erase failure blocks are output, a ready/busy signal output from said ready/busy signal register defines a period of the checking of the contents of the erase information hold means and the verify reading operation by said erase failure block detecting means to be a period in which the output of the contents of said address register is inhibited to be output to external.

6. A nonvolatile semiconductor memory according to claim 3, wherein, when the addresses of the erase failure blocks are output to external, the contents of said pass/fail signal register are maintained to a fail state until the output of the addresses of all of the erase failure blocks is completed and to a pass state after the output of the addresses of all of the erase failure blocks is completed, and the contents of said pass/fail signal register are output to external.

7. A nonvolatile semiconductor memory according to claim 2, wherein the erase failure block address outputting means outputs, when existence of erase failure blocks is detected, a fail signal from the pass/fail signal register, a ready signal from the ready/busy signal register and block addresses stored in the address register and further outputs, after all the block addresses of the erase failure blocks are output, a ready signal from the ready/busy signal register and a pass signal from the pass/fail signal register.

8. A nonvolatile semiconductor memory according to claim 7, further comprising:

verify control means for performing verify reading for memory cells in the cell blocks corresponding to the select data holding means in which select data are held after the data erasing, wherein:

the select data holding means hold the select data even after verify reading performed by the verify control means; and the erase failure block detecting means, the erase failure block addresses outputting means and the verify control means are controlled so as to output, when existence of erase failure blocks is detected, block addresses of the erase failure blocks and then continue verify reading with the busy signal output, and after this when existence of erase failure blocks is detected, stop the verify reading and output block addresses as of this time from the address register with a ready signal output from the ready/busy signal register.

9. A nonvolatile semiconductor memory according to claim 7, wherein:

the select data holding means reset select data corresponding to cell blocks in which normal erasing of data has been detected by the erase failure block detecting means; and the erase failure block detecting means and the erase failure block address outputting means retrieve select data held by the select data holding means corresponding to all cell blocks targeted for plural block simultaneous data erasing, stop the retrieving when erase failure blocks exist holding select data and output block addresses as of this time from the address register with a ready signal output from the ready/busy signal register.

* * * * *